US008492836B2

(12) United States Patent
Miura et al.

(10) Patent No.: US 8,492,836 B2
(45) Date of Patent: Jul. 23, 2013

(54) POWER SEMICONDUCTOR DEVICE

(75) Inventors: Naruhisa Miura, Tokyo (JP); Shuhei Nakata, Tokyo (JP); Kenichi Ohtsuka, Tokyo (JP); Shoyu Watanabe, Tokyo (JP); Shiro Hino, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/500,659

(22) PCT Filed: Oct. 14, 2009

(86) PCT No.: PCT/JP2009/005356
§ 371 (c)(1),
(2), (4) Date: Apr. 6, 2012

(87) PCT Pub. No.: WO2011/045834
PCT Pub. Date: Apr. 21, 2011

(65) Prior Publication Data
US 2012/0205669 A1    Aug. 16, 2012

(51) Int. Cl.
*H01L 29/66* (2006.01)
(52) U.S. Cl.
USPC .... 257/339; 257/328; 257/337; 257/E29.256; 257/E21.41
(58) Field of Classification Search
USPC .......... 257/339, 328, 337, 334, 329, E29.256, 257/E21.41
See application file for complete search history.

(56) References Cited

U.S. PATENT DOCUMENTS

| 4,532,534 | A | | 7/1985 | Ford et al. | |
| 5,191,395 | A | | 3/1993 | Nishimura | |
| 5,686,750 | A | * | 11/1997 | Takahashi | 257/328 |
| 5,821,599 | A | * | 10/1998 | Rupp | 257/467 |
| 6,037,631 | A | | 3/2000 | Deboy et al. | |
| 6,049,108 | A | | 4/2000 | Williams et al. | |
| 7,262,434 | B2 | * | 8/2007 | Okamura et al. | 257/77 |
| 2008/0079078 | A1 | | 4/2008 | Noguchi et al. | |
| 2008/0224150 | A1 | * | 9/2008 | Suzuki et al. | 257/77 |

FOREIGN PATENT DOCUMENTS

| JP | 59-65483 | 4/1984 |
| JP | 59-87871 | 5/1984 |
| JP | 4-767 | 1/1992 |
| JP | 5-198816 | 8/1993 |

(Continued)

OTHER PUBLICATIONS

International Preliminary Report on Patentability issued Apr. 26, 2012, in PCT/JP2009/005356.

(Continued)

*Primary Examiner* — Julia Slutsker
(74) *Attorney, Agent, or Firm* — Oblon, Spivak, McClelland, Maier & Neustadt, L.L.P.

(57) ABSTRACT

In a semiconductor device according to the present invention, a p-type well region disposed in an outer peripheral portion of the power semiconductor device is divided into two parts, that is, an inside and an outside, and a field oxide film having a greater film thickness than the gate insulating film is provided on a well region at the outside to an inside of an inner periphery of the well region. Therefore, it is possible to prevent, in the gate insulating film, a dielectric breakdown due to the voltage generated by the flow of the displacement current in switching.

15 Claims, 8 Drawing Sheets

FOREIGN PATENT DOCUMENTS

| | | |
|---|---|---|
| JP | 10-56174 | 2/1998 |
| JP | 11-154748 | 6/1999 |
| JP | 2000-101085 | 4/2000 |
| JP | 2000-294770 | 10/2000 |
| JP | 2006-173281 | 6/2006 |
| JP | 2008-85189 | 4/2008 |

OTHER PUBLICATIONS

International Search Report and Written Opinion of the International Searching Authority issued Jan. 19, 2010, in PCT/JP2009/005356 (with English-language translation).

U.S. Appl. No. 13/806,534, filed Dec. 21, 2012, Furukawa, et al.

* cited by examiner

POWER SEMICONDUCTOR DEVICE

TECHNICAL FIELD

The present invention relates to a power semiconductor device such as a silicon carbide semiconductor device.

BACKGROUND ART

Referring to a power semiconductor device constituted by a power vertical metal-oxide film-semiconductor field effect transistor (Metal Oxide Semiconductor Field Effect Transistor:MOSFET) and a diode which is described in Patent Document 1, diodes are arranged in at least one line in a peripheral edge portion of a cell region of the MOSFET, that is, an adjacent region to a gate pad portion as shown in FIGS. 1 and 2 of the Document. Each of the diodes absorbs a hole injected in a forward bias into an N-type semiconductor layer on a drain side from a P well and a P base shown in FIG. 2 of the Document when the MOSFET is switched from an ON state to an OFF state. For this reason, the structure described in the Document can prevent a parasitic transistor shown in FIG. 3 of the Document from being turned ON when the MOSFET is switched from the forward bias into a reverse bias.

With the structure described in the Document, the P base being the P well of the MOSFET is electrically connected to a source electrode through a back gate as shown in FIG. 2.

PRIOR ART DOCUMENT

Patent Document

Patent Document 1: Japanese Patent Application Laid-Open No. 05-198816 (1993) (FIGS. 1 to 3)

SUMMARY OF THE INVENTION

Problems to be Solved by the Invention

The problem to be solved by the present invention will be described below with reference to FIG. 2 of the Patent Document 1.

When the MOSFET of the power semiconductor device described in the Patent Document 1 is switched from an ON state into an OFF state, a drain voltage of the MOSFET, that is, a voltage of a drain electrode may be rapidly raised and may reach approximately several hundreds V in some cases. Due to the rise in the drain voltage, when the OFF state is brought, a displacement current is generated on a drain electrode side and a source electrode side respectively through a capacity of a depletion layer which is formed between the P well and an N-drain layer. The displacement current is also generated in a diode as well as the P well of the MOSFET if the P well or a place in which a P-type region is provided in the N-drain layer in the same manner as the P well.

Referring to the displacement current thus generated, the displacement current generated on the drain electrode side exactly flows to the drain electrode, while the displacement current generated on the source electrode side flows to the source electrode via the P well or the P-type region.

In the case of the power semiconductor device described in the Patent Document 1, the source electrode and a field plate are electrically connected to each other as described in the description of the example of the related art. For this reason, in the section shown in FIG. 2(C), for example, the displacement current flowing into the P well provided under the gate pad flows in the MOSFET cell direction toward the contact hole connected to the field plate in the P well provided under the gate pad and then flows into the source electrode through the field plate.

Here, the area of the P well provided under the gate pad is much larger than the areas of the P well of the MOSFET cell and the P well of the diode cell. When the displacement current flows to the P well provided under the gate pad, therefore, a voltage having a value which cannot be disregarded is generated in the P well because the P well itself having a large area and the contact hole have resistances of which values are great to some degree. As a result, a relatively high electric potential is generated in a position in the P well having a great distance in a plane direction from a place (contact hole) in which the P well is electrically connected to a source electrode (which is usually connected to a ground potential) through the field plate.

The larger the displacement current is, the greater the electric potential is. The higher a fluctuation dV/dt of the drain voltage V to a time t is, the greater the electric potential is.

Here, description will be given again to a high-speed driving operation of a silicon carbide MOSFET, that is, a driving operation with high dV/dt.

In an Si-MOSFET to be a unipolar element using conventional Si (silicon), an operation is carried out at a relatively high operating speed, that is, 20 V/nsec or more. If the operation is carried out at a high voltage of approximately 1 kV or more, however, a conduction loss is greatly increased. For this reason, the operating voltage is limited to several tens to several hundreds V. In a high voltage region of approximately 1 kV or more, therefore, an Si-IGBT (Insulated Gate Bipolar Transistor) is mainly utilized. Because the IGBT is a bipolar element, however, it is hard to obtain a high-speed switching characteristic as in a unipolar element by an influence of minor carriers. In other words, even if dV/dt is increased, a switching loss cannot be decreased greatly. For this reason, it is not necessary to carry out a driving operation with high dV/dt, and the Si-IGBT is used at an operating speed of approximately several V/nsec at most.

On the other hand, in the MOSFET using the silicon carbide, it is possible to obtain a small conduction loss also in a high voltage region of 1 kV or more, and furthermore it is possible to carry out a high-speed operation because of the unipolar element and to reduce a switching loss through high-speed switching. Therefore, a loss in an inverter operation can be reduced still more.

In an operation environment which cannot be obtained in the conventional Si element, that is, high-speed switching of 10 V/nsec or more in a high voltage region operation of 1 kV or more, for example, the voltage to be generated in the P well through the displacement current in switching described above is made more remarkable.

In the case where the MOSFET is formed by using the silicon carbide, furthermore, an element having a sufficiently low p-type impurity level is not present in a band gap of the silicon carbide. For this reason, it is impossible to obtain p-type silicon carbide having a low resistivity in the vicinity of a room temperature, and furthermore, a contact resistance of the p-type silicon carbide and a metal is also increased. In the case where an MOSFET power semiconductor device is constituted by using the silicon carbide, accordingly, a value of a contact resistance of the P well constituted by the p-type silicon carbide and a metal is particularly increased so that a voltage to be generated by a displacement current is also increased.

In the power semiconductor device including the MOSFET, when a voltage of a gate electrode reaches the vicinity of 0 V immediately after the MOSFET is switched from an ON state into an OFF state in a place in which a gate insulating film of the MOSFET is interposed between the P well and the gate electrode, a high voltage is generated in the P well as described above so that the gate insulating film is broken due to a high electric field caused by the high voltage in some cases. In order to obtain a power semiconductor device having a high reliability, it is desirable that an electric field to be applied to a silicon dioxide film being the gate insulating film should be set to be equal to or smaller than 3 MV/cm. For this purpose, the voltage to be generated in the P well by the displacement current is to be set to have a certain value or less.

In order to solve such a problem, the present invention has been made and has an object to provide a highly reliable power semiconductor device including an MOSFET for carrying out switching at a high speed and being capable of suppressing an occurrence of a dielectric breakdown between a gate electrode and a source electrode in switching.

Means for Solving the Problems

A power semiconductor device according to the present invention includes: a semiconductor substrate of a first conductivity type; a drift layer of the first conductivity type formed on a first main surface side of the semiconductor substrate; a cell region formed in a part of a surface layer of the drift layer and including a plurality of unit cells; a second well region of a second conductivity type formed apart from the cell region so as to surround the cell region; a gate insulating film formed on at least the cell region and on at least the cell region side on the second well region; a third well region of the second conductivity type formed apart from the second well region on an outside of the second well region; a field oxide film formed to an inside of an inner periphery of the third well region on the third well region and having a greater film thickness than the gate insulating film; a gate electrode formed on the field oxide film and on the gate insulating film; a source contact hole formed to penetrate the gate insulating film on the cell region; a first well contact hole formed to penetrate the gate insulating film on the second well region; a second well contact hole formed to penetrate the filed oxide film on the third well region; a source pad for electrically connecting the cell region, the second well region and the third well region through the source contact hole, the first well contact hole and the second well contact hole; and a drain electrode provided on a second main surface side opposite to the first main surface side.

Effect of the Invention

According to the power semiconductor device in accordance with the present invention, also in the case in which the power semiconductor device is driven at a high speed, an electric field having a high intensity is not applied to a gate insulating film and a dielectric breakdown is suppressed from occurring in the gate insulating film, whereby a more highly reliable power semiconductor device can be obtained.

EMBODIMENT FOR CARRYING OUT THE INVENTION

First Embodiment

In a first embodiment of the present invention, description will be given by mainly using a vertical n-type channel silicon carbide MOSFET as an example of a power semiconductor device. Furthermore, in each of the following embodiments description will be given on the assumption that a first conductivity type is set to be an n-type and a second conductivity type is set to be a p-type, and a conductivity type of a semiconductor may be reverse thereto.

Figure 1:
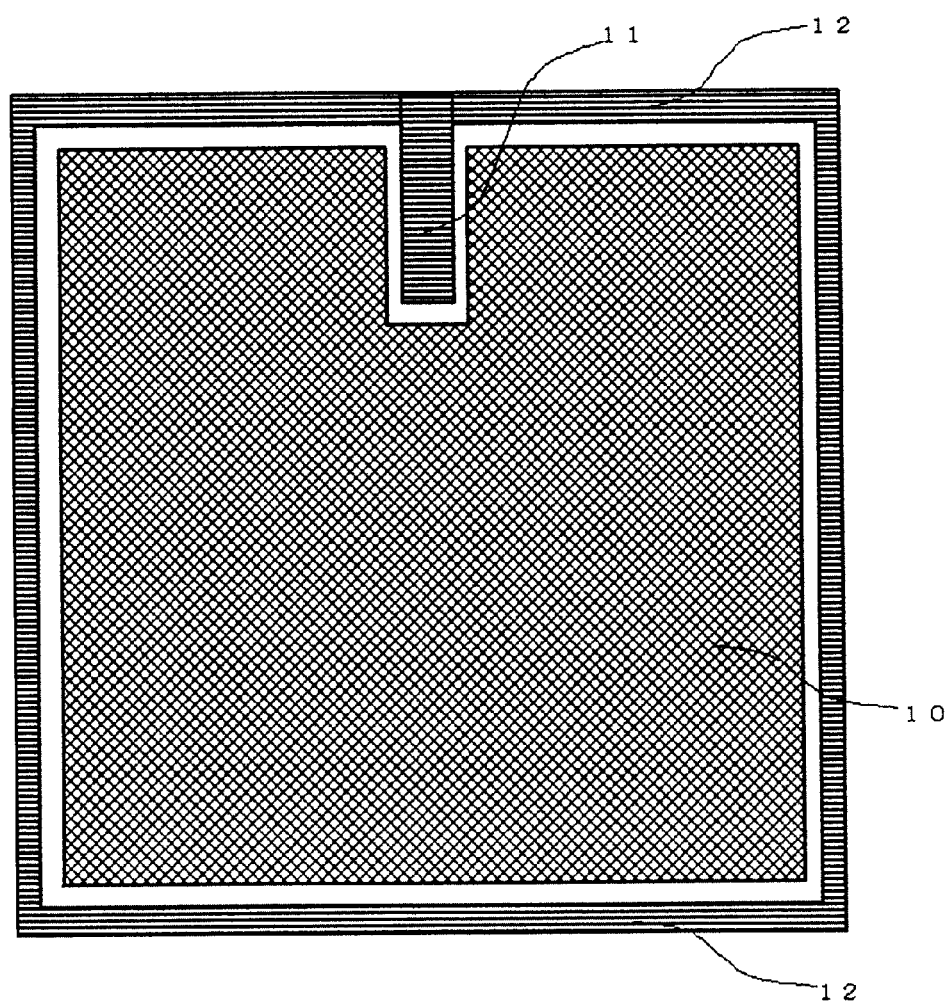
FIG. 1 is a plan view schematically illustrating a power semiconductor device according to a first embodiment of the present invention.

FIG. 1 is a plan view schematically illustrating a power semiconductor device, as seen from an upper surface, mainly using a silicon carbide MOSFET being the power semiconductor device according to the first embodiment of the present invention. In FIG. 1, a source pad 10 is provided in a central part of the upper surface of the power semiconductor device. A gate pad 11 is provided on one of sides seen from an upper surface of the source pad 10. Furthermore, a gate wiring 12 is provided in an extension from the gate pad 11 so as to surround the source pad 10.

The source pad 10 is electrically connected to source electrodes of a plurality of MOSFET unit cells provided on a lower part of the source pad 10, and the gate pad 11 and the gate wiring 12 are electrically connected to a gate electrode of the unit cell and serves to apply a gate voltage supplied from an external control circuit to the gate electrode.

Figure 2:
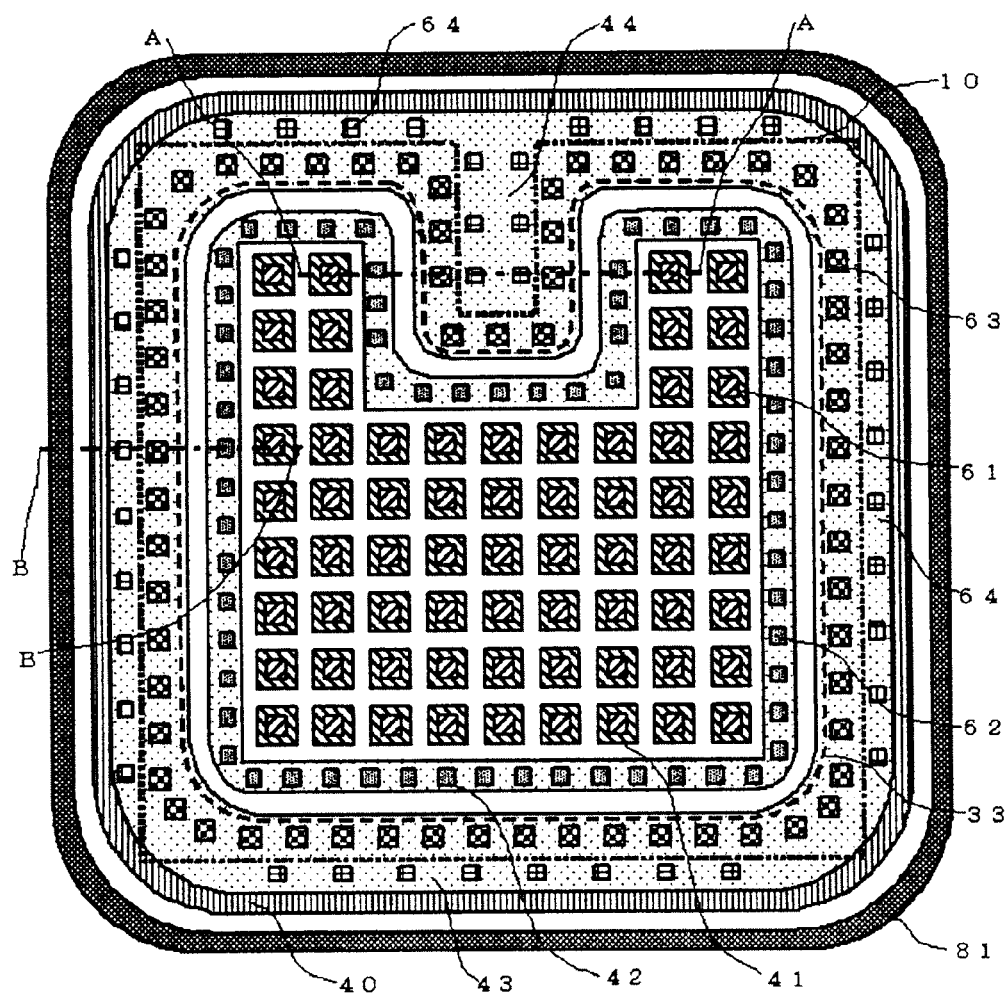
FIG. 2 is a plan view schematically illustrating the power semiconductor device according to the first embodiment of the present invention.

FIG. 2 is a plan view illustrating layers provided below the source pad 10, the gate pad 11 and the like in the power semiconductor device according to the present embodiment shown in FIG. 1 as seen from an upper part. In FIG. 2, a hole referred to as a second well contact hole 63 is formed in an interlayer insulating film (not shown) provided on a whole surface in a lower part of the source pad 10 around the lower part of the source pad 10 shown in FIG. 1. Third well regions 43 and 44 formed of p-type silicon carbide are provided in layers constituted by silicon carbide in lower parts of the respective second well contact holes 63. In addition, a p-type junction termination extension (Junction Termination Extension: JTE) region 40 is provided on an outside of the third well regions 43 and 44.

A first well contact hole 62 which is formed in the interlayer insulating film and a second well region 42 which is formed in a lower part thereof are formed at a predetermined interval of 0.5 μm or more from the second well contact hole 63 and the third well regions 43 and 44 at an inside surrounded by the second well contact hole 63 and the third well regions 43 and 44 as seen in a plan view. The second well region 42 is constituted by the p-type silicon carbide.

A cell region provided with a large number of the unit cells are disposed on an inside surrounded by the first well contact holes 62 and the second well regions 42 as seen in the plan view. A plurality of source contact holes 61 which are formed in the interlayer insulating film and first well regions 41 which are formed in each of lower parts thereof are formed in the cell region. The details of the cell region will be separately described below with reference to sectional views.

Furthermore, a gate electrode not shown is formed on a part of upper portions of the third well regions 43 and 44, and a gate control hole 64 being a hole for electrically connecting the gate pad 11, the gate wiring 12 and the gate electrode is formed in the interlayer insulating film.

Figure 3:
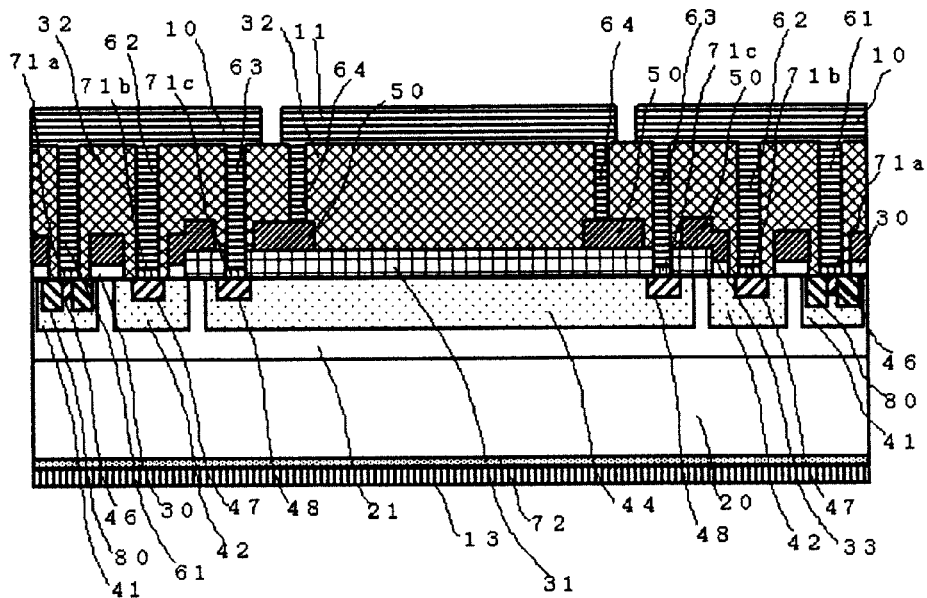
FIG. 3 is a sectional view schematically illustrating a section of a part of the power semiconductor device according to the first embodiment of the present invention.
Figure 4:
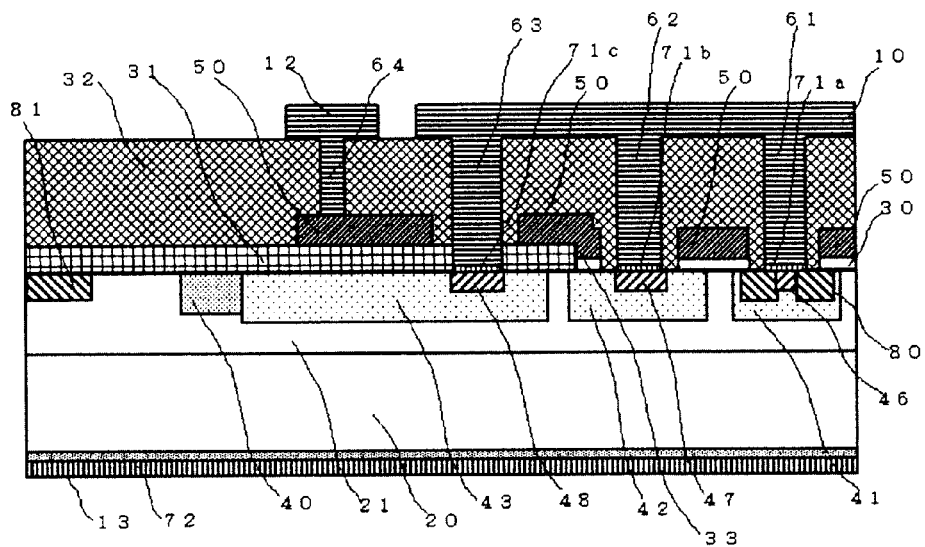
FIG. 4 is a sectional view schematically illustrating a section of a part of the power semiconductor device according to the first embodiment of the present invention.

FIGS. 3 and 4 are schematic sectional views showing the power semiconductor device according to the present embodiment, schematically illustrating a section of an A-A portion and a section of a B-B portion in the plan view of FIG. 2, respectively.

In FIGS. 3 and 4, a drift layer 21 constituted by n-type silicon carbide is formed on a surface of a substrate 20 constituted by n-type silicon carbide having a low resistance. Third well regions 44 and 43 constituted by the p-type silicon carbide are provided on a surface layer portion of the drift layer 21 in a region in which the gate pad 11 and the gate electrode 12 are provided as described with reference to FIG. 2.

A p-type second well region 42 constituted by silicon carbide is provided at a predetermined interval from the third well regions 43 and 44 in the surface layer portion of the drift layer 21 at an inside of the third well regions 43 and 44 as seen from the entire power semiconductor device (both sides of the third well region 44 in FIG. 3 and a right side of the third well region 43 in FIG. 4). Furthermore, a plurality of p-type first well regions 41 constituted by the silicon carbide is provided at a predetermined interval in the least from the second well region 42 in the surface layer portion of the drift layer 21 at an inside as seen from the entire power semiconductor device (both sides of the second well region 42 in FIG. 3 and a right side of the second well region 42 in FIG. 4).

An n-type source region 80 is formed, in each of the surface layer portions of the first well regions 41, in a position recessed from an outer periphery of each of the first well regions 41 into an inner part by a predetermined interval. Furthermore, a first well contact region 46 is provided in a surface layer portion on an inner part surrounded by the source region 80 in the first well region 41. Furthermore, a second well contact region 47 and a third well contact region 48 which have low resistances and are of the p-type are provided in the surface layer portions of the second well region 42 and the third well regions 43 and 44, respectively.

In FIG. 4, a p-type JTE region 40 is formed in the surface layer portion of the drift layer 21 at a further outside of the third well region 43 (a left side in FIG. 4) as seen from the entire power semiconductor device as described with reverence to FIG. 2. In addition, an n-type field stopper region 81 is formed at a predetermined interval on an outside of the JTE region 40 (the left side in FIG. 4).

A gate insulating film 30 constituted by silicon dioxide or a field oxide film 31 constituted by the silicon dioxide is formed in contact with upper surface of the drift layer 21 in which the first to third well regions 41 to 44, the source region 80, first to third well contact regions 46 to 48 and the field stopper region 81 are formed. The gate insulating film 30 is formed on an upper portion of the first well region 41 being the cell region and a part of an upper portion of the second well region 42, and the field oxide film 31 is formed on an outside thereof (an inside in FIG. 3 and the left side in FIG. 4) as seen from the entire power semiconductor device. In the power semiconductor device according to the present embodiment, a gate insulating film field oxide film boundary 33 between the gate insulating film 30 and the field oxide film 31 is formed on an upper part of the second well region 42.

A gate electrode 50 is formed in a part of the upper portions of the gate insulating film 30 and the field oxide film 31 in contact with the gate insulating film 30 and the field oxide film 31. The gate electrode 50 is provided on the gate insulating film 30 on the outer periphery of the first well region 41 and the like, is electrically connected from a portion on the gate insulating film 30 to a portion on the field oxide film 31, and is connected to the gate electrode 11 or the gate wiring 12 over the field oxide film 31 through a gate contact hole 64 formed to penetrate the interlayer insulating film 32 formed on the field oxide film 31.

A source contact hole 61 is provided to penetrate an insulating film including the interlayer insulating film 32 over the source region 80 and the first well contact region 46 in the first well region 41. Furthermore, a first well contact hole 62 is provided to penetrate the insulating film including the interlayer insulating film 32 over the second well contact region 47 of the second well region 42. Furthermore, a second well contact hole 63 is provided to penetrate the interlayer insulating film 32 and the field oxide film 31 over the third well contact region 48 of the third well regions 43 and 44.

The first to third well regions 41 to 44 are electrically connected to each other by the source pad 10 with an ohmic electrode 71 interposed therebetween through the source contact hole 61 and the first and second well contact holes 62 and 63.

Furthermore, a drain electrode 13 is formed on a back side of the substrate 20 through a back ohmic electrode 72.

Here, a diode is formed between the p-type second well region 42 and third well region 43 connected to the source pad 10 through the first well contact hole 62 and the second well contact hole 63 and the n-type drift layer 21 connected to the drain electrode 13 through the substrate 20 and the back ohmic electrode 72. In the vertical MOSFET, moreover, a conduction of the region (channel region) of the p-type first well region 41, provided in contact with the gate insulating film 30, between the n-type source region 80 and the n-type drift layer 21 can be controlled with a voltage of the gate electrode 50 on the gate insulating film 30. In the power semiconductor device according to the present embodiment, a diode is connected in parallel between the source and the drain in the MOSFET.

Figure 5:
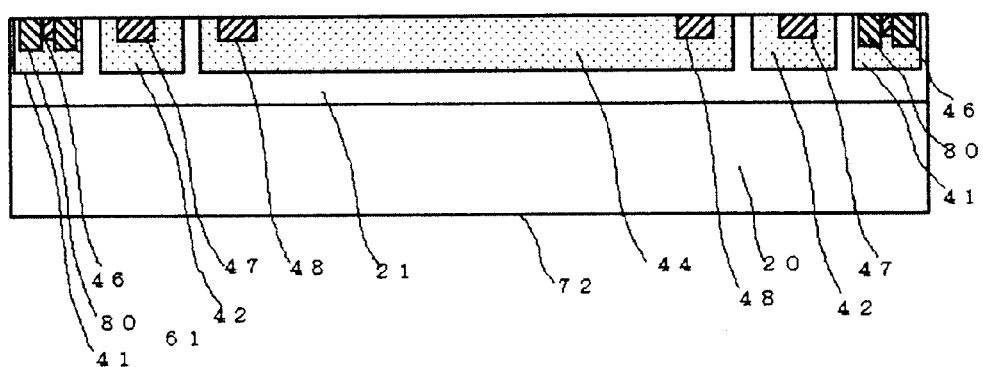
FIG. 5 is a sectional view schematically illustrating a part of the power semiconductor device for describing a process of manufacturing the power semiconductor device according to the first embodiment of the present invention.
Figure 5:
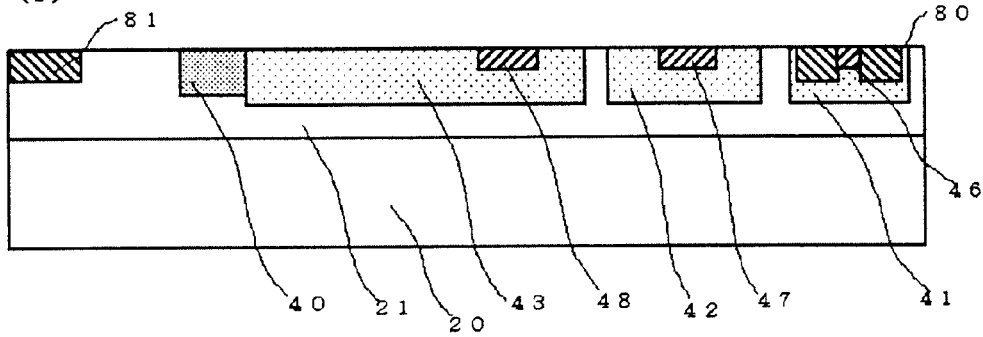
Figure 6:
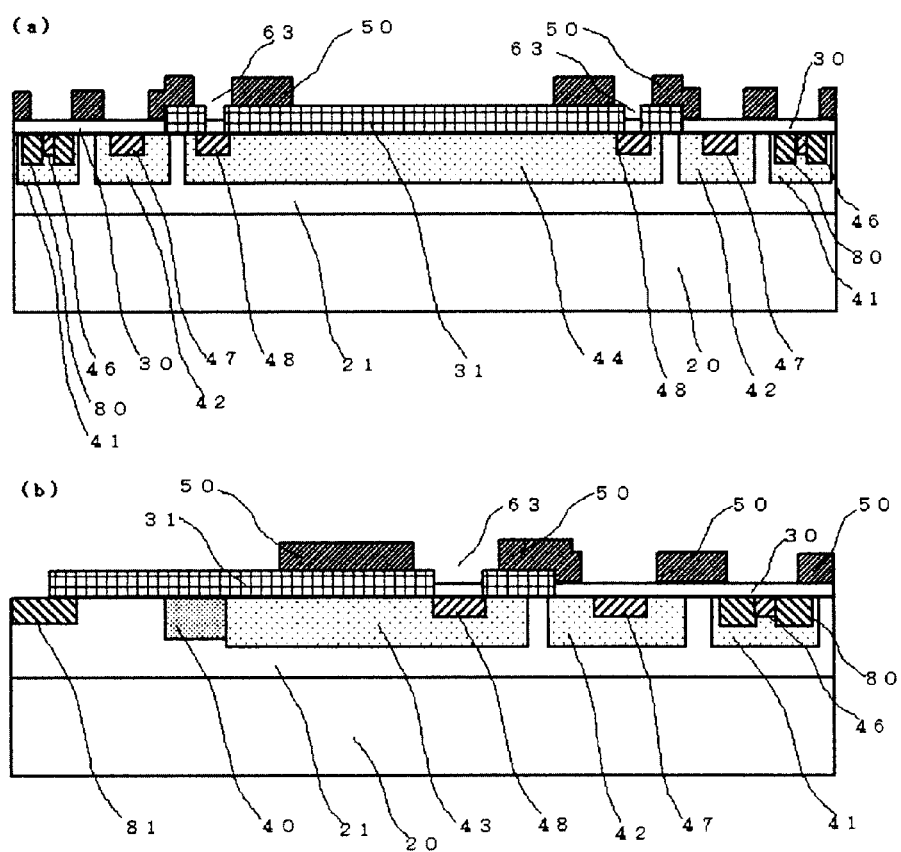
FIG. 6 is a sectional view schematically illustrating a part of the power semiconductor device for describing a process for manufacturing the power semiconductor device according to the first embodiment of the present invention.

Next, a method of manufacturing the power semiconductor device according to the present embodiment will be described with reference to FIGS. 5 and 6. FIGS. 5 and 6 are sectional views schematically illustrating a part of the power semiconductor device for describing a process of manufacturing the power semiconductor device according to the present embodiment. In FIGS. 5 and 6, part (a) corresponds to a sectional view showing an A-A sectional portion in FIG. 2 and part (b) corresponds to a sectional view showing a B-B sectional portion in FIG. 2.

First, the drift layer 21 constituted by silicon carbide having an n-type impurity concentration of $1\times10^{13}$ cm$^{-3}$ to $1\times10^{18}$ cm$^{-3}$ and a thickness of 4 to 200 μm is epitaxially grown by a chemical vapor deposition (Chemical Vapor Deposition: CVD) method on a surface (a first main surface) of the substrate 20 which is of an n-type, has a low resistance and is formed of silicon carbide. Although the substrate 20 of the silicon carbide semiconductor which is used has a polytype in an orientation of the first main surface of 4H in a (0001) plane and is inclined to a c-axis direction at 8° or less, another orientation, polytype or inclination may be employed and no inclination may be applied.

As shown in FIG. 5, subsequently, the p-type first well region 41, the p-type second well region 42, the p-type third well regions 43 and 44, the p-type JTE region 40, the n-type source region 80, the field stopper region 81, the first well contact region 46, the second well contact region 47 and the third well contact region 48 are formed by ion implantation in predetermined positions in the surface of the drift layer 21. Al (aluminum) or B (boron) is suitable for a p-type impurity for the ion implantation, and N (nitrogen) or P (phosphorus) is suitable for an n-type impurity for the ion implantation. Furthermore, the semiconductor substrate 20 does not need to be heated positively in the ion implantation or may be heated at 200 to 800° C.

It is necessary to set each of depths of the first well region 41, the second well region 42 and the third well regions 43 and 44 to be equal to or smaller than a depth of a bottom surface of the drift layer 21 which is an epitaxial crystal growth layer, and a value in a range of 0.3 to 2 μm can be set, for example. Moreover, p-type impurity concentrations of each of the first well region 41, the second well region 42 and the third well regions 43 and 44 is set to be higher than an impurity concentration of the drift layer 21 being the epitaxial crystal growth layer, and is set into a range of $1\times10^{15}$ cm$^{-3}$ to $1\times10^{19}$ cm$^{-3}$.

The depth of the source region 80 is set in such a manner that a bottom surface thereof does not exceed the bottom surface of the first well region 41 and an n-type impurity concentration is set to be higher than the p-type impurity concentration of the first well region 41 and to be into a range of $1\times10^{17}$ cm$^{-3}$ to $1\times10^{21}$ cm$^{-3}$. It is sufficient that the field stopper region 81 is formed on the same condition as the source region 80.

However, only in the vicinity of an outermost surface of the drift layer 21, the p-type impurity concentrations of each of the first well region 41, the second well region 42 and the third well regions 43 and 44 may be lower than the n-type impurity concentration of the drift layer 21 in order to enhance a conductivity in a channel region of the silicon carbide MOSFET.

The first well contact region 46, the second well contact region 47 and the third well contact region 48 are provided in order to obtain an excellent electrical contact of the first well region 41, the second well region 42 and the third well regions 43 and 44 with the source pad 10 with the ohmic electrode 71 interposed therebetween, and their impurity concentrations are desirably set to be higher than the p-type impurity concentrations of the first well region 41, the second well region 42 and the third well regions 43 and 44. When ion implanting the impurities having the high concentrations, moreover, it is desirable to heat the semiconductor substrate 20 to 150° C. or more, and carry out the ion implantation.

Subsequently, annealing is carried out in an inactive gas atmosphere such as an argon (Ar) gas or a nitrogen gas or in vacuum at a temperature of 1500° C. to 2200° C. for 0.5 to 60 minutes so that the impurity thus ion-implanted is electrically activated. In an execution of the annealing, it is also possible to carry out the annealing in a state in which the semiconductor substrate 20 and a film formed thereon are covered with a carbon film. By carrying out the annealing through the coverage with the carbon film, it is possible to prevent a silicon carbide surface from being roughened due to a residual moisture, residual oxygen or the like in the equipment during the annealing.

Next, the surface of the drift layer 21 subjected to the ion implantation as described above is sacrificially oxidized to form a thermal oxide film, and the thermal oxide film is removed with hydrofluoric acid to remove a surface altered layer of the drift layer 21 subjected to the ion implantation, thereby exposing a clean surface. By using a CVD method, a photolithographic technique and the like, subsequently, an active region having a cell region as a center is opened to form a silicon dioxide film having a film thickness of approximately 0.5 to 2 μm which is referred to as a field oxide film 31 in a region other than the cell region. Here, there is also removed the field oxide film 31 in a position to be the second well contact hole 63 of the field oxide film 31 on the third well regions 43 and 44. Thus, the formation of the second well contact hole 63 can be performed at the same time on the same condition as the formation of the source contact hole 61, for example, consequently, the process can be simplified.

Furthermore, the gate insulating film 30 constituted by a silicon dioxide film having a thickness which is smaller than the thickness of the field oxide film 31 and is approximately 1/10 of the thickness of the field oxide film 31, for example, is formed in the active region having the cell region as the center by using a thermal oxidation method or a deposition method.

The thickness of the gate insulating film 30 is preferably equal to or greater than 30 nm and equal to or smaller than 300 nm, and is more preferably equal to or greater than 50 nm and equal to or smaller than 150 nm. Note that the value of the film thickness depends on how much level of a gate voltage and a gate field are when the MOSFET is to be driven (a switching operation), and the gate field (an electric field to be applied to the gate insulating film 30) is preferably equal to or smaller than 3 MV/cm.

Subsequently, the gate electrode 50 constituted by a polycrystalline silicon material is formed at a predetermined place by using the CVD method, the photolithographic technique and the like on the gate insulating film 30 and the field oxide film 31. It is desirable that the polycrystalline silicon to be used for the gate electrode 50 should contain P or B and have a low resistance. P or B may be introduced during the formation of the polycrystalline silicon film or may be introduced by the ion implantation after the formation of the film. Furthermore, the gate electrode 50 may be a multilayer film of the polycrystalline silicon and a metal or a multilayer film of the polycrystalline silicon and metal silicide.

An outermost end face of the gate electrode 50 may be disposed on the field oxide film 31. Consequently, it is possible to prevent a deterioration in quality of the gate insulating film 30 exposed at the end face due to overetching on the end face through a dry etching process.

Next, the interlayer insulating film 32 constituted by a silicon dioxide film is formed on the gate electrode 50 and the like by the deposition method such as the CVD method. Subsequently, the interlayer insulating film 32 in places to be the source contact hole 61, the first well contact hole 62 and the second well contact hole 63 are removed by using the photolithographic technique and the dry etching technique.

Then, a heat treatment at a temperature of 600 to 1100° C. is carried out after a formation of a metal film containing Ni as a main component by a sputtering method or the like, and the metal film containing Ni as the main component is reacted with a silicon carbide layer to form silicide between the silicon carbide layer and the metal film. Subsequently, residue metal film on the interlayer insulating film 32 other than the silicide formed by the reaction is removed through wet etching using sulfuric acid, nitric acid or hydrochloric acid, or their mixed solution with a hydrogen peroxide solution, or the like.

Thus, silicide formed in the source contact hole 61, the first well contact hole 62 and the second well contact hole 63 serves as ohmic electrodes 71(*a*), 71(*b*) and 71(*c*) as shown in FIGS. 3 and 4, and an ohmic contact is carried out for both an n-type silicon carbide region such as the source region 80 and a p-type silicon carbide region such as the first well region 41.

Furthermore, the interlayer insulating film 32 in the portion being the gate contact hole 64 is removed by using the photolithographic technique and the dry etching technique. Subsequently, a metal containing Ni as a main component is formed on a back face (a second main surface) of the substrate 20 and a heat treatment is then carried out thereto so that the back ohmic electrode 72 is formed on the back side of the substrate 20.

Thereafter, a wiring metal such as Al is formed on the surface of the substrate by the sputtering method or an evaporation method, and is processed to have a predetermined shape by the photolithographic technique so that the source pad 10, the gate pad 11 and the gate wiring 12 are formed. Furthermore, the metal film is formed on the surface of the back ohmic electrode 72 on the back face of the substrate so that the drain electrode 13 is formed. Thus, it is possible to manufacture a power semiconductor device shown in the sectional views of FIGS. 3 and 4.

Next, description will be given to an operation of the power semiconductor device according to the present embodiment.

In the power semiconductor device according to the present invention, as described with reference to FIG. 2, a pn diode (to which the positions of the first well region 42, the third well regions 43 and 44 and the like in FIG. 2 correspond) is provided around the cell region in which a plurality of unit cells constituting the MOSFET (which are almost coincident with the position of the first well region 41 in FIG. 2) is formed in parallel. Herein, a source and a gate in the MOSFET (an n-type MOSFET in the present embodiment) are integrated with an electrode of a second conductivity type (the p-type in the present embodiment) in the pn diode, and a drain of the MOSFET (the n-type MOSFET in the present embodiment) is integrated with an electrode of a first conductivity type (the n-type in the present embodiment) in the pn diode.

When a voltage to be applied to the gate (the gate pad 11 in the present embodiment) of the MOSFET is varied in such a manner that the MOSFET is switched from an ON state into an OFF state, a voltage of the drain (the drain electrode 13 in the present embodiment) of the MOSFET is rapidly raised and is varied from almost 0 V to several hundreds V. Consequently, a displacement current flows in both of p- and n-type regions through parasitic capacitances generated between the p-type first well region 41, second well region 42, third well regions 43 and 44 and JTE region 40, and the n-type drift layer 21, respectively. In the p-type region, the displacement current flows from the p-type first well region 41 and second well region 42, and the like toward the source pad 10.

By the displacement current, there is generated a voltage determined by a resistance value, including a contact resistance value of a contact portion, in a region in which the displacement current flows and a value of the displacement current. Because an area of the first well region 41 is not large, a resistance value of the same region is not great and a generated voltage is limited to have a certain value. The second well region 42 has a comparatively large area. However, a large number of first well contact holes 62 are provided and there is no second well region 42 which is distant from the first well contact hole 62. Therefore, even if the displacement current flows to the source pad 10 via the second well region 42, the second well contact region 47, and the ohmic electrode 71*b* of the first well contact hole 62, a high voltage is not generated. On the other hand, a p-type region obtained by including the third well regions 43 and 44 and the JTE region 40 connected thereto has a large area, and the third well region which is distant from the second well contact hole 63 is present. For this reason, the displacement current flows to the source pad 10 via the third well regions 43 and 44, the third well contact region 48, and the ohmic electrode 71*c* of the second well contact hole 63 so that a resistance value of the current path is made relatively great and a voltage to be generated in the vicinity of the second well contact hole 63 also has a great value.

The larger a fluctuation dV/dt of the drain voltage V to a time t is, the greater the voltage to be generated in the vicinity of the second well contact hole 63 is.

In some cases in which the gate electrode 50 is formed through the gate insulating film 30 on a place in which such a high electric potential is generated, a dielectric breakdown may occur in the gate insulating film 30 between the gate electrode 50 in which the MOSFET is set into the OFF state and the voltage is almost 0 V and a place in which a high electric potential is generated.

In the power semiconductor device according to the present embodiment, an insulating film in the vicinity of the second well contact hole 63 through which the third well regions 43 and 44 and the JTE region 40 are connected to the source pad 10 is formed by the field oxide film 31 which has a greater film thickness than the gate insulating film 30, and the gate electrode 50 is formed on the field oxide film 31. Even if the operation is carried out on a high dV/dt condition, therefore, an electric field to be generated can be reduced. Thus, it is possible to obtain a power semiconductor device having a high reliability without causing the dielectric breakdown of the field oxide film 31.

In order to verify the effect of the present invention, a numerical calculation was carried out. In the case in which an OFF signal was input to the gate pad 11 to carry out a driving operation for causing a variation in a drain voltage of approximately dV/dt=2V/nsec in the structure according to the present invention is not employed, that is, the power semiconductor device in which the second well region 42 is not isolated from the third well regions 43 and 44 and the third well contact region 48 is not provided, an electric field of 10 MV/cm or more was calculated to be generated transiently in the gate insulating film 30 in the vicinity of the gate insulating film field oxide film boundary 33 which is covered with the gate electrode 50. On the other hand, also in the case in which the OFF signal was input to the gate pad 11 of the power semiconductor device according to the present embodiment of the present invention to carry out a high-speed driving operation for generating a variation in a drain voltage of approximately dV/dt=60 V/nsec, an electric field to be induced into the gate insulating film 30 in the vicinity of the gate insulating film field oxide film boundary 33 which is covered with the gate electrode 50 was calculated to be 3 MV/cm.

Furthermore, a power semiconductor device which employs the structure according to the present embodiment and a power semiconductor device which does not employ the same structure are actually fabricated to compare their driving speed responsiveness. Although there was generated an element breakdown regarded to be an insulation failure due to a fluctuation in a voltage of approximately dV/dt=10 V/nsec in the power semiconductor device which does not employ the structure according to the present embodiment, the element breakdown did not occur by a fluctuation in a voltage of dV/dt=60 V/nsec or more in the power semiconductor device which employs the structure according to the present embodiment.

Also in the case in which switch-off is carried out in such a manner that a switching speed of the drain voltage of the MOSFET is 10 V/nsec or more, thus, the voltage to be generated by the displacement current can be reduced so that a magnitude of the electric field to be induced into the gate insulating film 30 can be set to be equal to or smaller than 3 MV/cm. The dielectric breakdown can be prevented from occurring in an insulating film formed in the upper part of the p well region, for example, the third well region 43 or 44 having a large area.

According to the power semiconductor device in accordance with the present embodiment of the present invention, accordingly, also in the case in which the switching is carried out at a high speed, the insulation failure of the gate insulating film 30 does not occur. Thus, it is possible to obtain a semiconductor device having a high reliability.

In the power semiconductor device according to the present embodiment, moreover, the gate wiring 12 is disposed on the outside of the second well contact hole 63 being the well contact hole of the well on the outermost periphery. For this reason, it is not necessary to form a field plate on the outside of the gate wiring 12 and a size of the power semiconductor device can be reduced, consequently, it is possible to cut down a cost of the power semiconductor device.

Although the interval between the second well region 42 and the third well regions 43 and 44 is set to be the predetermined interval which is equal to or greater than 0.5 μm in the power semiconductor device according to the present embodiment, the present invention is not restricted thereto but the interval may be approximately 0.5 to 5 μm which is almost equal to the interval between the first well regions 41 in the cell region.

In some cases in which the interval between the second well region 42 and the third well regions 43 and 44 is excessively reduced, a current generated in the third well regions 43 and 44 in switching reaches the second well region 42 due to tunneling so that there may be eliminated the effect of the separation of the second well region 42 and the third well regions 43 and 44. In some cases in which the interval between the second well region 42 and the third well regions 43 and 44 is excessively increased, moreover, an electric field to be induced into the field oxide film 31 provided above a portion between the second well region 42 and the third well regions 43 and 44 may be increased when the MOSFET is OFF. Consequently, in some cases, the reliability of the element may be deteriorated. It is desirable that an electric field value to be induced into the field oxide film 31 should be equal to or smaller than approximately 3 MV/cm in order to ensure the reliability of the element. For this reason, it is sufficient that the interval between the second well region 42 and the third well regions 43 and 44 should be equal to or smaller than the interval between the first well regions 41 in the cell region, for example, 5 μm.

Although the description has been given to the power semiconductor device according to the present embodiment in which the first well contact region 46, the second well contact region 47 and the third well contact region 48 are provided in order to reduce the contact resistance between the ohmic electrode 71 and the first well region 41, second well region 42 and third well regions 43 and 44, moreover, these well contact regions are not indispensable and do not need to be always provided. In other words, if it is possible to obtain a sufficiently low contact resistance by changing a metal for forming the ohmic electrode 71 so as to be suitable for the p-type silicon carbide, it is not necessary to form the well contact regions 46 to 48. Furthermore, the field stopper region 81 is not indispensable and does not need to be always provided.

Although the formation of the source contact hole 61, the first well contact hole 62 and the second well contact hole 63 and formation of the gate contact hole 64 are separately carried out in the description of the method of manufacturing the power semiconductor device according to the present embodiment, moreover, it is also possible to simultaneously carry out the formation of the source contact hole 61, the first well contact hole 62 and the second well contact hole 63 and formation of the gate contact hole 64. By simultaneously carrying out the formation of the source contact hole 61, the first well contact hole 62 and the second well contact hole 63 and formation of the gate contact hole 64, it is possible to reduce the processes and to cut down a cost in the manufacture.

Although the heat treatment for forming the ohmic electrode 71 on the surface side and the heat treatment for forming the back ohmic electrode 72 on the back side are separately carried out in the description of the method of manufacturing the power semiconductor device according to the present embodiment, furthermore, it is also possible to carry out the heat treatment after the formation of a metal containing Ni as a main component on both the surface side and the back side, thereby forming the ohmic electrode 71 on the surface side and the back ohmic electrode 72 on the back side at the same time. Consequently, it is also possible to reduce the processes and to cut down the cost in the manufacture.

Although, in the power semiconductor device, an electrode for a temperature sensor and an electrode for a current sensor are formed in a part of the power semiconductor device, moreover, these electrodes may be formed in the power semiconductor device according to the present embodiment. The presence of the electrode for the temperature sensor and the electrode for the current sensor does not influence the effect of the power semiconductor device according to the present embodiment at all.

Although the positions and number of the gate pads 11, the shape of the source pad 10 and the like can be various, furthermore, these do not influence the effect of the power semiconductor device according to the present embodiment in the same manner as the presence of the electrode for the current sensor and the like.

Furthermore, as not shown in the drawings, the source pad 10, the gate pad 11 and the gate wiring 12 which are provided on the surface of the upper part of the power semiconductor device may be covered with a protective film such as a silicon nitride film or polyimide in a state in which an opening enabling a connection to an external control circuit is left.

The description has been given to the example in which the impurity doped polycrystalline silicon is used as the material of the gate electrode 50 in the power semiconductor device according to the present embodiment. Because the resistance of the impurity doped polycrystalline silicon is not sufficiently low, in some cases, the electric potential of the gate electrode 50 in a distant place from the connecting position to the gate pad 11 may make a time lag from the electric potentials of the gate pad 11 and the gate wiring 12. The time lag is determined by a time constant defined by a resistance component such as the resistance of the gate electrode 50 and a parasitic capacitance formed together with the source pad 10 or the like. In the present embodiment, the gate wiring 12 having a low resistance is provided in parallel with the gate electrode 50 in the lower part of the gate wiring 12 to thereby suppress the occurrence of the time lag described above.

Although the description and the illustration have been given to the power semiconductor device according to the present embodiment in which the p-type impurity concentrations and the depths of the first well region 41, the second well region 42 and the third well regions 43 and 44 are equal to each other, moreover, the impurity concentrations and the depths of these regions do not need to be equal to each other but may have separate values, respectively.

Figure 7:
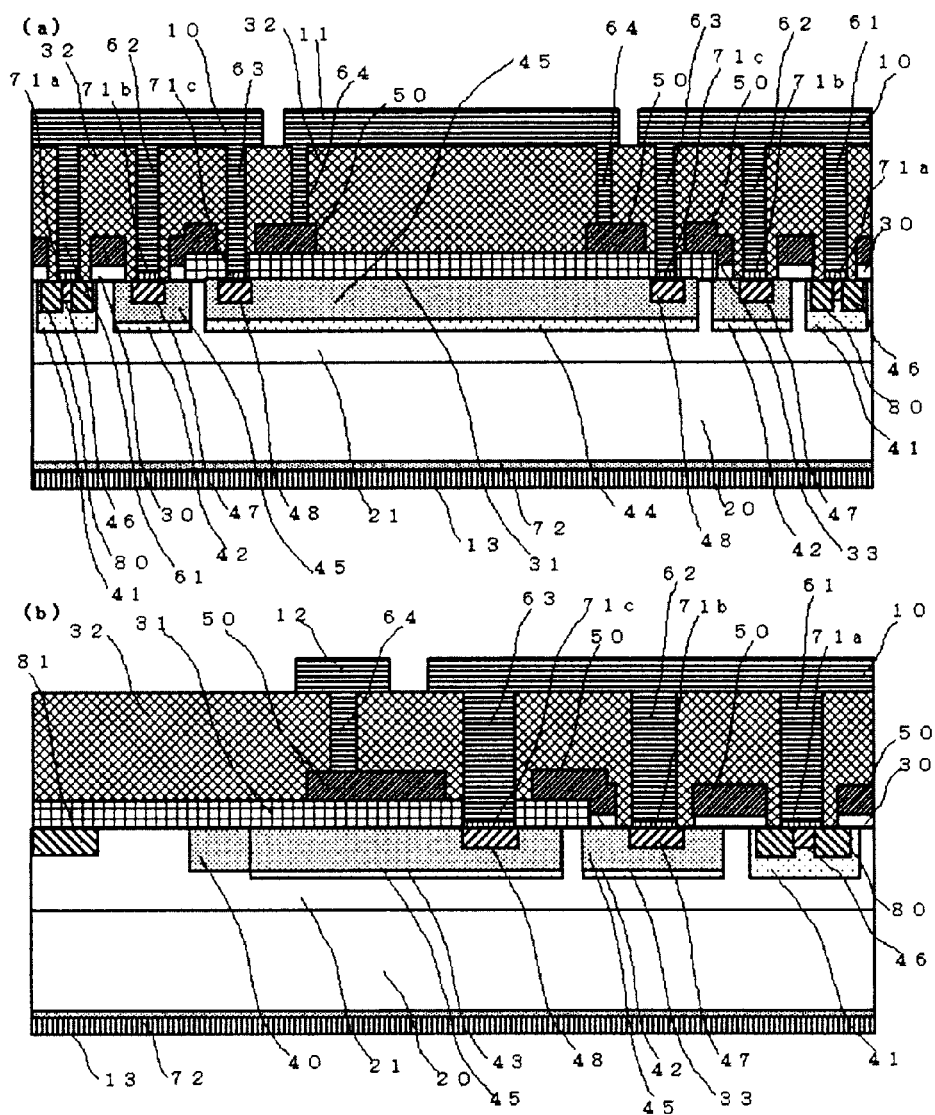
FIG. 7 is a sectional view schematically illustrating a part of the power semiconductor device according to the first embodiment of the present invention.

As shown in the sectional view of FIG. 7, furthermore, the p-type impurity concentration may be increased by additional ion implantation into the surface layer portions in order to enhance the conductivities of the second well region 42 and the third well regions 43 and 44 other than the first well region 41 to be a channel of the MOSFET. In addition, it is also possible to simultaneously carry out the additional ion implantation and the ion implantation into the JTE region 40. In FIG. 7, part (a) shows a section crossing a gate pad and part (b) shows a section of a termination portion.

Figure 8:
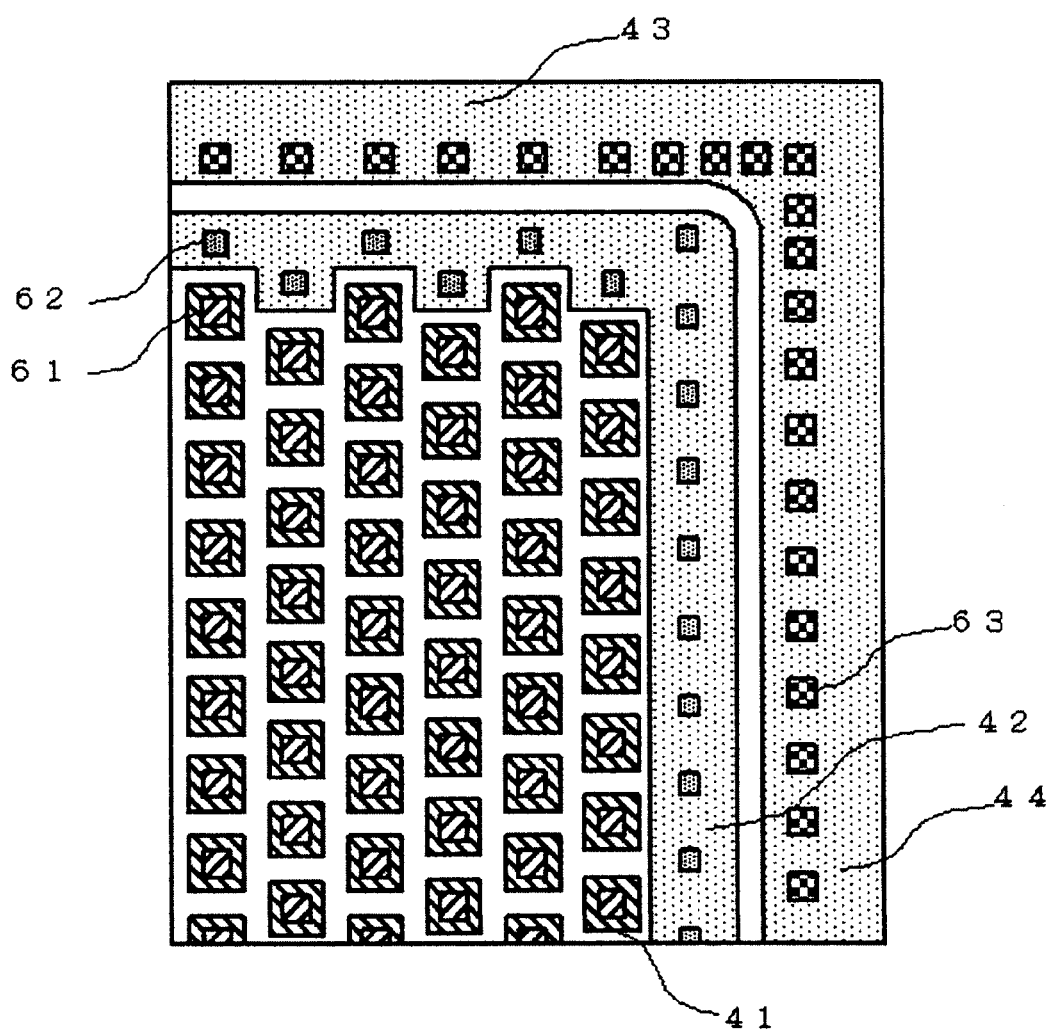
FIG. 8 is a sectional view schematically illustrating a part of the power semiconductor device according to the first embodiment of the present invention.

Furthermore, the method of arranging the unit cell in the cell region does not need to be identical to that shown in FIG. 2 in which the square unit cell is arranged like a grid but the unit cells in the adjacent lines to each other may be alternately disposed as shown in a perspective top view illustrating a part of the power semiconductor device in FIG. 8, for example. FIG. 8 is a plan view showing the vicinity of the connecting portion of the gate pad 11 and the gate wiring 12 which are a part of the power semiconductor device as seen from an upper surface. In addition, as shown in FIG. 8, a large number of second well contact holes 63 may be disposed in a corner portion in which the third well region for causing a displacement current to easily concentrate thereon takes a concave shape as seen from a top. Although the second well contact hole 63 is singly disposed in FIG. 8, it may be provided doubly or triply. By such an arrangement, it is possible to reduce an electric potential which is generated by a displacement current to be increased with a rise in the contact resistance of the second well contact hole 63.

Second Embodiment

Figure 9:
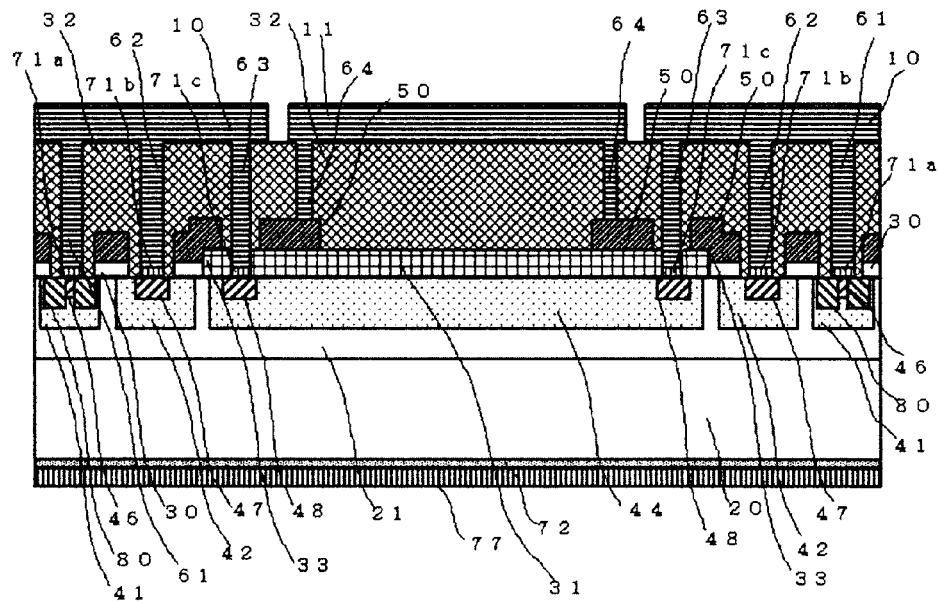
FIG. 9 is a sectional view schematically illustrating a part of the power semiconductor device according to a second embodiment of the present invention.
Figure 10:
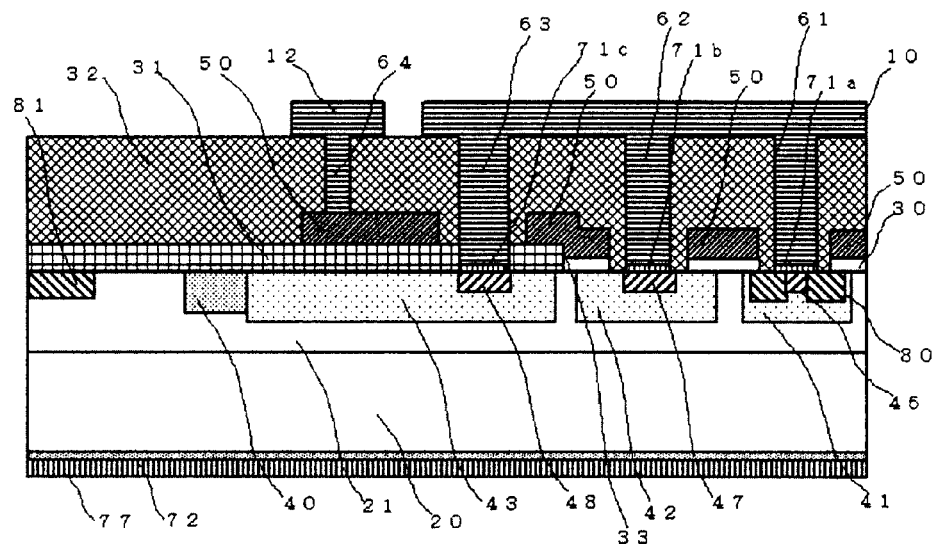
FIG. 10 is a sectional view schematically illustrating a part of the power semiconductor device according to the second embodiment of the present invention.

FIGS. 9 and 10 are schematic sectional views showing a power semiconductor device according to a second embodiment of the present invention, and views seen from an upper surface are the same as FIGS. 1 and 2 according to the first embodiment. FIG. 9 is a sectional view illustrating an A-A section in FIG. 2 and FIG. 10 is a sectional view showing a B-B section in FIG. 2.

The power semiconductor device according to the present embodiment is characterized in that a boundary between a gate insulating film 30 and a field oxide film 31 (a gate insulating film field oxide film boundary 33) is provided on an upper part between a second well region 42 and third well regions 43 and 44 as shown in FIGS. 9 and 10, and the other respects are the same as in the first embodiment. Therefore, detailed description will not be repeated.

By the power semiconductor device according to the present embodiment, the third well regions 43 and 44 in which a high voltage might be generated by a displacement current can be entirely covered with the field oxide film 31 which is thicker than the gate insulating film 30, thus, it is possible to obtain a power semiconductor device in which a dielectric breakdown is hard to occur and a high reliability is obtained.

In the first and second embodiments, there is disclosed the case in which the semiconductor element to be formed in the cell region is a vertical MOSFET. Even if a collector layer of a second conductivity type is provided between the silicon carbide semiconductor substrate 20 and the back ohmic electrode 72 on the back side shown in FIG. 3 to constitute a semiconductor element having a cell region of an IGBT, for example, the effect of the present invention is also achieved for the semiconductor element having the cell region of the IGBT. Accordingly, the scope of the effect of the present invention includes a semiconductor element as a switching element having an MOS structure such as the MOSFET or the IGBT. Note that in the case in which the semiconductor element is the IGBT, a drain (electrode) of the MOSFET corresponds to a collector (electrode) and a source (electrode) of the MOSFET corresponds an emitter (electrode).

In the present invention, furthermore, the semiconductor element itself having the MOSFET structure described in the first and second embodiments is defined as a "semiconductor device" in a narrow sense, and a power module itself incorporating the semiconductor element, for example, such as an inverter module which is equipped with a lead frame and is thus sealed together with the semiconductor element having the MOSFET structure, a free wheel diode connected in antiparallel with the semiconductor element and a control circuit for generating and applying a gate voltage of the semiconductor element or the like is also defined as the "semiconductor device" in a broad sense.

EXPLANATION OF REFERENCE SIGNS 10 source pad, 11 gate pad, 12 gate wiring, 13 drain electrode, 20 substrate, 21 drift layer, 30 gate insulating film, 31 field oxide film, 32 interlayer insulating film, 33 gate insulating film field oxide film boundary, 40 JTE region, 41 first well region, 42 second well region, 43, 44 third well region, 46, 47, 48 well contact region, 50 gate electrode, 61 source contact hole, 62 first well contact hole, 63 second well contact hole, 64 gate contact hole, 71 ohmic electrode, 72 back ohmic electrode, 80 source region.

The invention claimed is:

1. A power semiconductor device, comprising:
a semiconductor substrate of a first conductivity type;
a drift layer of the first conductivity type formed on a first main surface side of said semiconductor substrate;
a cell region formed in a part of a surface layer of said drift layer and comprising a plurality of unit cells;
a gate insulating film formed on said cell region;
a well region of a second conductivity type different from the first conductivity type formed apart from said cell region on an outside of said cell region;
a field oxide film formed on said well region;
a gate electrode formed over said well region and over said cell region, wherein said field oxide is thicker than said gate insulating film under an entire portion of said gate electrode which is over said well region;

a source pad, which electrically connects said cell region and said well region through a source contact hole formed on said cell region, and a well contact hole formed on said well region; and a drain electrode provided on a second main surface side opposite to said first main surface of said semiconductor substrate.

2. The device of claim 1, further comprising:
another well region,
wherein an interval between said another well region and said well region is equal to or greater than 0.5 μm and is equal to or smaller than 5 μm.

3. The device of claim 1, wherein said semiconductor substrate is a silicon carbide semiconductor substrate and said drift layer comprises a silicon carbide material.

4. The device of claim 1, further comprising:
another well region,
wherein a boundary between said gate insulating film and said field oxide film is provided on an upper part of said another well region.

5. The device of claim 1, further comprising:
another well region,
wherein a boundary between said gate insulating film and said field oxide film is provided on an upper part between said another well region and said well region.

6. The device of claim 1, further comprising:
another well region,
wherein:
each of said unit cells include an additional well region of the second conductivity type and a source region of the first conductivity type formed in a part of a surface layer of said additional well region, and
wherein said additional well region has a lower impurity concentration than said another well region and said well region.

7. The device of claim 1, further comprising:
another well region,
wherein when switch-off is carried out at a switching speed of a voltage of the drain electrode of 10 V/nsec or more, an electric field to be induced into said gate insulating film interposed between said another well region and said gate electrode is equal to or smaller than 3 MV/cm.

8. The device of claim 1, wherein a gate wiring is provided on an outside of the well contact hole.

9. The device of claim 1, wherein more well contact holes exist at a corner portion on said well region than in other regions on said well region.

10. The device of claim 1, further comprising:
at least one selected from the group consisting of a temperature sensor electrode and a current sensor electrode.

11. A power module, comprising:
a lead frame mounting the power semiconductor device of claim 1; and
a control circuit, which controls an operation of said power semiconductor device.

12. A method for manufacturing a power semiconductor device, the method comprising:
forming a drift layer of a first conductivity type on a first main surface side of a semiconductor substrate of the first conductivity type;
forming a well region of a second conductivity type in a surface layer of said drift layer;
forming a field oxide film on said well region;
forming a gate insulating film on a cell region of a surface layer of the drift layer;
forming a gate electrode on said field oxide film and on said gate insulating film, said field oxide is thicker than said gate insulating film under an entire portion of said gate electrode which is over said well region;
forming a source pad for electrically connecting said cell region and said well region through a source contact hole and a well contact hole; and
forming a drain electrode on a second main surface side opposite to said first main surface of said semiconductor substrate.

13. The method of claim 12, wherein
said forming of the field oxide comprises removing said field oxide film in a place where said well contact hole is formed.

14. The device of claim 1, wherein a thickness of the gate insulating film is equal to or greater than 30 nm and equal to or smaller than 300 nm.

15. The device of claim 1, wherein a thickness of the gate insulating film is equal to or greater than 50 nm and equal to or smaller than 150 nm.

* * * * *